US011949425B2

(12) United States Patent
Hsieh et al.

(10) Patent No.: US 11,949,425 B2
(45) Date of Patent: Apr. 2, 2024

(54) DIGITAL-TO-ANALOG CONVERTER (DAC)-BASED VOLTAGE-MODE TRANSMIT DRIVER ARCHITECTURE WITH TUNABLE IMPEDANCE CONTROL AND TRANSITION GLITCH REDUCTION TECHNIQUES

(71) Applicant: XILINX, INC., San Jose, CA (US)

(72) Inventors: Kai-An Hsieh, Tainan (TW); Tan Kee Hian, Singapore (SG)

(73) Assignee: XILINX, INC., San Jose, CA (US)

( * ) Notice: Subject to any disclaimer, the term of this patent is extended or adjusted under 35 U.S.C. 154(b) by 240 days.

(21) Appl. No.: 17/669,254

(22) Filed: Feb. 10, 2022

(65) Prior Publication Data
US 2023/0253975 A1    Aug. 10, 2023

(51) Int. Cl.
*H03M 1/08*    (2006.01)
*H03M 1/76*    (2006.01)
*H04L 25/02*    (2006.01)

(52) U.S. Cl.
CPC ......... *H03M 1/0863* (2013.01); *H03M 1/765* (2013.01); *H04L 25/0272* (2013.01); *H04L 25/0278* (2013.01)

(58) Field of Classification Search
CPC . H03M 1/0863; H03M 1/765; H04L 25/0272; H04L 25/0278
USPC ........................................................ 341/144
See application file for complete search history.

(56) References Cited

U.S. PATENT DOCUMENTS

| | | | |
|---|---|---|---|
| 6,538,499 B1 | 3/2003 | Lu | |
| 6,603,331 B1 | 8/2003 | Om'Mani et al. | |
| 6,611,218 B1 | 8/2003 | Lu et al. | |
| 6,842,041 B1 | 1/2005 | Om'Mani et al. | |
| 7,227,382 B1 * | 6/2007 | Talbot | H04L 25/0278 326/87 |
| 7,313,373 B1 | 12/2007 | Laskharian et al. | |
| 8,436,642 B1 | 5/2013 | Kireev et al. | |
| 8,654,823 B1 | 2/2014 | Zhu et al. | |

(Continued)

OTHER PUBLICATIONS

Chan, K. L. et al., "A 32.75-Gb/s Voltage-Mode Transmitter With Three-Tap FFE in 16-nm CMOS," in IEEE Journal of Solid-State Circuits, vol. 52, No. 10, pp. 2663-2678, Oct. 2017.

(Continued)

*Primary Examiner* — Khai M Nguyen
(74) *Attorney, Agent, or Firm* — Patterson + Sheridan, LLP (57) ABSTRACT

A digital-to-analog converter (DAC)-based voltage-mode transmit driver architecture. One example transmit driver circuit generally includes an impedance control circuit coupled to a plurality of DAC driver slices. The impedance control circuit generally includes a tunable impedance configured to be adjusted to match a load impedance for the transmit driver circuit. Another example transmit driver circuit generally has an output impedance that is smaller than the load impedance for the transmit driver circuit, such that an output voltage swing at differential output nodes of the transmit driver circuit is greater than a voltage of a power supply rail. Another example transmit driver circuit generally includes a predriver circuit with a first inverter coupled to a first output of the predriver circuit and a second inverter coupled to a second output of the predriver circuit, the transistors in at least one of the first inverter or the second inverter having different strengths.

20 Claims, 7 Drawing Sheets

(56) References Cited

U.S. PATENT DOCUMENTS

| | | |
|---|---|---|
| 9,674,015 B2 | 6/2017 | Kireev et al. |
| 9,712,257 B1 | 7/2017 | Tan et al. |
| 9,832,048 B2 | 11/2017 | Kireev |
| 9,841,455 B2 | 12/2017 | McLeod et al. |
| 9,954,630 B1 | 4/2018 | Venna |
| 10,063,232 B1 * | 8/2018 | Tan .................. H03K 19/0185 |
| 10,348,290 B1 | 7/2019 | Zhang et al. |
| 10,491,436 B1 | 11/2019 | Lim et al. |
| 11,196,418 B1 | 12/2021 | Suryanarayana et al. |

OTHER PUBLICATIONS

Tan, K. et al., "A 112-GB/S PAM4 Transmitter in 16NM FinFET," 2018 IEEE Symposium on VLSI Circuits, 2018, pp. 45-46.
Choi, M. et al., "8 An Output-Bandwidth-Optimized 200Gb/s PAM-4 100Gb/s NRZ Transmitter with 5-Tap FFE in 28nm CMOS," 2021 IEEE International Solid- State Circuits Conference (ISSCC), 2021, pp. 128-13.

\* cited by examiner

DIGITAL-TO-ANALOG CONVERTER (DAC)-BASED VOLTAGE-MODE TRANSMIT DRIVER ARCHITECTURE WITH TUNABLE IMPEDANCE CONTROL AND TRANSITION GLITCH REDUCTION TECHNIQUES

TECHNICAL FIELD

Examples of the present disclosure generally relate to electronic circuits and, more particularly, to a transmit driver circuit.

BACKGROUND

The use of high-speed serial communication links in electronic systems has continued to grow. In certain cases, serial links may be used for inter-integrated circuit (IC) communications within an electrical device (e.g., a serial bus between memory and a processing system) and/or between electrical devices (e.g., serial bus between a computer and a wearable device). In other cases, serial links may be used for inter-circuit communications within a system-on-a-chip (SoC). High-speed serial communication links can operate according to various standards such as Universal Serial Bus (USB), High-Definition Multimedia Interface (HDMI), Serial Advanced Technology Attachment (SATA), and Peripheral Component Interconnect Express (PCIe) interfaces. A serializer/deserializer (SerDes) may be used to transmit and receive data via a serial communication link. A SerDes transmitter serializes a multi-bit word into a serial data stream of corresponding bits. A SerDes receiver deserializes the received serial data stream into the original multi-bit word. In some SerDes systems, a clock signal is transmitted along with the serial data stream, whereas in other SerDes systems, the clock signal is instead embedded in the serial data stream.

SUMMARY

Certain aspects of the present disclosure generally relate to a digital-to-analog converter (DAC)-based transmit driver architecture, such as for a serializer/deserializer (SerDes) transmitter.

Certain aspects of the present disclosure provide a transmit driver circuit. The transmit driver circuit generally includes differential output nodes for coupling to a load impedance for the transmit driver circuit, a plurality of digital-to-analog converter (DAC) driver slices, each DAC driver slice having a differential output pair coupled to the differential output nodes of the transmit driver circuit, and an impedance control circuit coupled to the plurality of DAC driver slices and comprising a tunable impedance configured to be adjusted to match the load impedance for the transmit driver circuit.

Certain aspects of the present disclosure provide a transmit driver circuit. The transmit driver circuit generally includes differential output nodes for coupling to a load impedance for the transmit driver circuit, a plurality of DAC driver slices, each DAC driver slice having a differential output pair coupled to the differential output nodes of the transmit driver circuit, and a power supply rail coupled to the plurality of DAC driver slices. An output impedance of the transmit driver circuit is smaller than the load impedance for the transmit driver circuit, such that an output voltage swing of the transmit driver circuit at the differential output nodes is configured to be greater than a voltage of the power supply rail.

Certain aspects of the present disclosure provide a transmit driver circuit. The transmit driver circuit generally includes a plurality of DAC driver slices. Each DAC driver slice generally includes a driver unit cell comprising a first pull-up transistor and a first pull-down transistor having a drain coupled to a drain of the first pull-up transistor, and a first predriver having a first output coupled to a gate of the first pull-up transistor and having a second output coupled to a gate of the first pull-down transistor. The first predriver generally includes a first inverter having an input coupled to a common input node of the first predriver and having an output coupled to the first output of the first predriver, and a second inverter having an input coupled to the common input node of the first predriver and having an output coupled to the second output of the first predriver. Transistors in at least one of the first inverter or the second inverter have different strengths.

Certain aspects of the present disclosure provide a programmable integrated circuit (IC) comprising a transmitter of a serializer/deserializer (SerDes) link. The transmitter may include a transmit driver circuit described herein.

Certain aspects of the present disclosure provide a method of driving data. The method generally involves providing power from a power supply rail to a plurality of DAC driver slices of a transmit driver circuit, wherein each DAC driver slice has a differential output pair coupled to differential output nodes of the transmit driver circuit, wherein the differential output nodes are coupled to a load impedance for the transmit driver circuit, and wherein an output impedance of the transmit driver circuit is smaller than the load impedance for the transmit driver circuit; and selectively configuring pull-up or pull-down of the plurality of DAC driver slices based on input data to generate a differential output signal at the differential output nodes and across the load impedance, wherein a voltage swing of the differential output signal is configured to be greater than a voltage of the power supply rail.

These and other aspects may be understood with reference to the following detailed description.

BRIEF DESCRIPTION OF DRAWINGS

So that the manner in which the above-recited features can be understood in detail, amore particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

To facilitate understanding, identical reference numerals have been used, where possible, to designate identical elements that are common to the figures. It is contemplated that elements of one example may be beneficially incorporated in other examples without specific recitation.

DETAILED DESCRIPTION

Examples of the present disclosure generally relate to a DAC-based transmit driver architecture with tunable impedance control and transition glitch reduction techniques, such as for a serializer/deserializer (SerDes) transmitter. In some examples, the transmit driver architecture may include an impedance control circuit with a tunable replica load designed to match the load impedance of the transmit driver. The impedance control circuit may provide impedance adjustment for the transmit driver circuit.

Additionally or alternatively, the transmit driver architecture may have multiple DAC slices, in which a predriver circuit in each DAC slice has two inverter paths in the final predriver stage. The two inverter paths may each have an inverter, and the transistors in at least one of the inverters may have different strengths. The two inverter paths may serve to reduce DAC output voltage glitches during data transitions.

Additionally or alternatively, the transmit driver architecture may be designed with an output impedance that is smaller than the load impedance for the transmit driver circuit. Such a design may cause an output voltage swing of the transmit driver circuit at the differential output nodes to be greater than a voltage of a power supply rail coupled to the multiple DAC driver slices.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example SerDes Circuit

Figure 1:
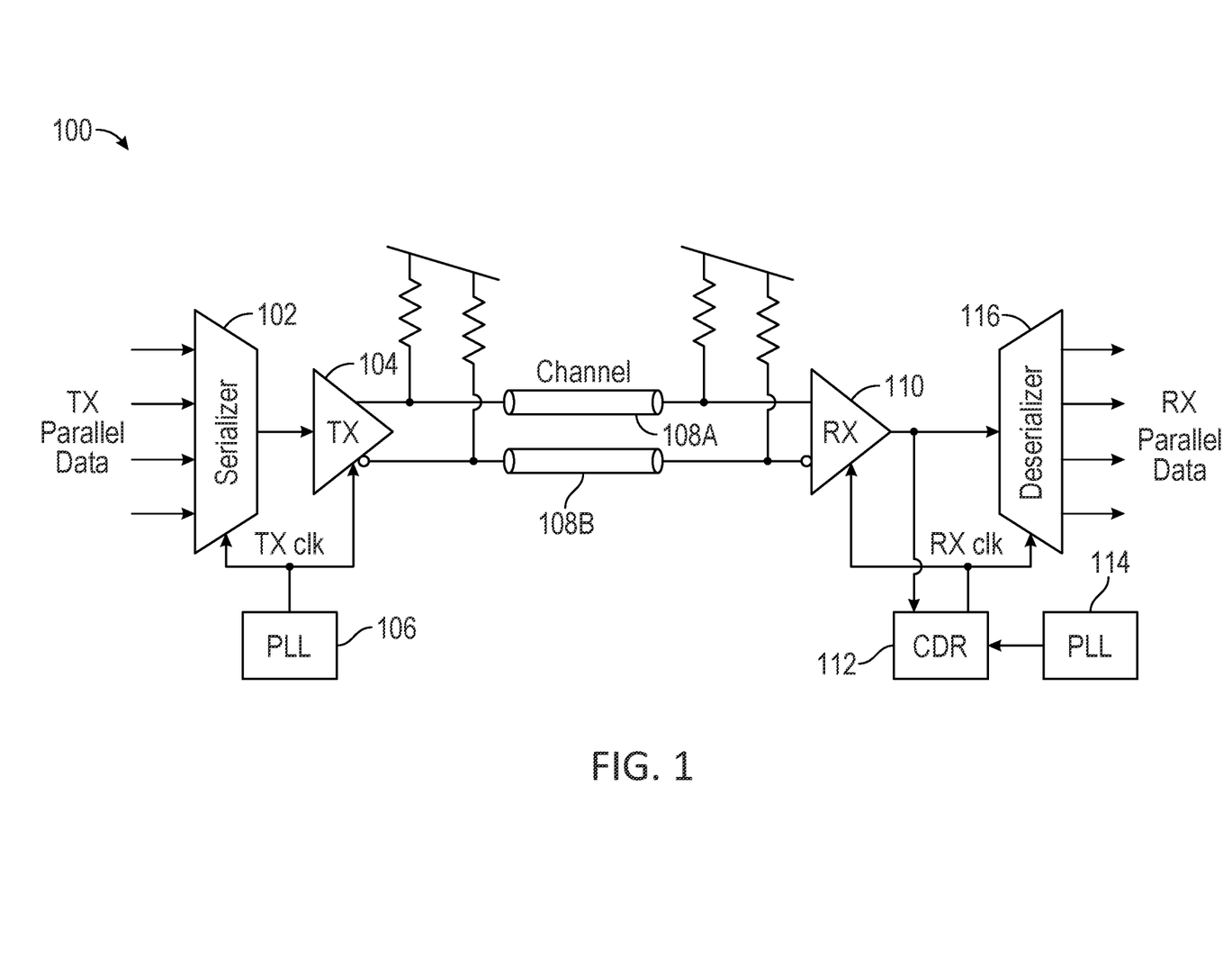
FIG. 1 is a block diagram of an example serializer/deserializer (SerDes) circuit having a SerDes transmitter and a SerDes receiver, in which aspects of the present disclosure may be practiced.

FIG. 1 is a block diagram of an example SerDes circuit 100, in which aspects of the present disclosure may be practiced. As shown, the SerDes circuit 100 may include a serializer 102, a SerDes transmitter 104 (labeled "TX"), a phase-locked loop (PLL) 106 for providing a transmit clock, a differential pair of serial channels 108A, 108B, a SerDes receiver 110 (labeled "RX"), a clock data recovery (CDR) circuit 112, a PLL 114 on the receive side, and a deserializer 116.

The serializer 102 converts data received on a parallel interface to a serial interface and provides a signal (e.g., a bitstream) of the serial data to the SerDes transmitter 104. The SerDes transmitter 104 may include a driver, which may amplify the serial data signal and output a differential signal on the serial channels 108A, 108B. The driver may be implemented as a voltage-mode driver or as a current-mode logic (CML) driver. In certain aspects, the SerDes transmitter 104 may also perform equalization to improve signal integrity of the SerDes circuit 100, such as by compensating (or at least adjusting) for loss in the channels 108A, 108B. The differential signal output by the SerDes transmitter 104 may be a low-voltage differential signal (LVDS), for example. In certain aspects, the serial channel 108A may carry the non-inverted signal of the differential pair, and the serial channel 108B may carry the inverted signal (i.e., the complementary signal) of the differential pair. In certain aspects, the differential signal output by the SerDes transmitter 104 may be sampled and generated according to the transmit clock output by the PLL 106. The PLL 106 may be used, for example, as a dock-synthesizer circuit that generates a high-speed master clock used for the serial data transmission.

The SerDes receiver 110 receives the differential signal of the serial data on the serial channels 108A, 108B and may amplify the received differential signal. In certain aspects, the SerDes receiver 110 may perform equalization of the received differential signal, in addition to the equalization performed by the SerDes transmitter 104. The CDR circuit 112 is coupled to the output of the SerDes receiver 110 and performs the timing recovery to recover the master clock used to sample the signals and generate a receive clock at the SerDes receiver 110. In certain aspects, the CDR circuit 112 may receive a reference clock signal via the PLL 114. The deserializer 116 converts the serial signal output by the SerDes receiver 110 to parallel form.

Signal transmission speed has rapidly increased in recent years and will continue to increase. In response, a digital-to-analog converter (DAC)-based transmit driver architecture has become widely used in high-speed electrical and optical systems because such an architecture (combined with digital signal processing (DSP) design) provides flexibility and low overhead in channel equalization implementation with multi-level signaling schemes (e.g., pulse-amplitude modulation (PAM)). DAC-based transmit schemes may be implemented with voltage-mode or current-mode driver topologies, although voltage-mode drivers may be significantly more power efficient than current-mode drivers (e.g., by about 4×).

For voltage-mode transmit drivers, impedance control may be utilized to meet both return loss and output swing specifications. In some slice-based transmit drivers, each driver slice may be identical and equally weighted, and the transmit terminal impedance (i.e., the driver output impedance) may be composed of the aggregate impedance of all the driver slices in parallel. Therefore, by changing the total number of slices enabled, the impedance mismatch due to process variations can be calibrated. In other words, the coarse impedance control of the transmit driver may be implemented based on the number of slices that are connected to a power supply at a given time.

However, DAC-based transmit drivers may have slices that are binary-weighted in order to translate the binary DAC codes into corresponding output voltage levels. Therefore, the number of DAC slices may not be reconfigurable for output impedance control. Accordingly, examples of the present disclosure provide a transmit driver architecture with an impedance control loop having a tunable impedance for impedance adjustment of the transmit driver.

Additionally, the output swing of a voltage-mode transmit driver may be determined by the impedance ratio between the driver output impedance and the driver's load impedance (e.g., the channel impedance). In some examples, the driver output impedance may be designed to be equal to the load impedance for impedance matching, such that power transfer is maximized, or at least improved. In such a case, the differential transmit output swing (e.g., 1 $V_{pp}$ swing) may be equal to the power supply voltage (e.g., 1 V) of the transmit driver. Transmit drivers frequently use predriver circuits, which may be implemented as a buffer or fan-out stage between the serializer and the driver. The predriver circuits operate on the highest speed data in the transmitter, so complementary metal-oxide-semiconductor (CMOS) buffers with core transistors (e.g., thin gate-oxide transistors) are often used to meet speed requirements. Due to reliability concerns, the core transistors in advanced processes typically operate with relatively low power supply voltages (e.g., 0.9 V or lower), which may be a lower voltage than that of the driver voltage supply. In this case, the voltage gap between the predriver voltage supply and the driver voltage supply may induce common-mode noise in the transmit output signal. Accordingly, examples of the present disclosure provide a transmit driver architecture with an output impedance that is smaller than the load impedance for the transmit driver, such that an output voltage swing of the transmit driver at the differential output nodes is configured to be greater than the supply voltage of the transmit driver.

Each slice in a voltage-mode DAC driver array may have a single or multiple driver unit cells. The differential driver unit cell may include a pair of CMOS inverters followed by resistors. The PMOS and NMOS transistors of the inverters may act as switches, whose control signals are driven by complementary predriver stages. By toggling the predriver stage output voltage of certain slices, the respective P- and N-type switches can be turned on/off accordingly in order to change DAC driver output level as called for. The current switching between different transistor switches is ideally expected to occur at the same time to ensure smooth output level transition. However, to turn on the switches, control signals need to surpass transistor threshold voltages, which may cause a timing delay on the "switch-on" paths.

By sweeping DAC input codes monotonically, an ideal DAC-based driver outputs a staircase waveform, but in practice, the output waveform includes voltage spikes (e.g., glitches) during output transitions. The timing skew in current switching as described above results in undesired transient current, which may cause the output voltage spikes during data transitions. These voltage spikes may be particularly apparent when switching between most significant bit (MSB) and least significant bit (LSB) processing. Additionally, in the case of high-speed applications, the width of the voltage spikes may be close to the unit interval (UI) of data transmitted, which may reduce link performance. Accordingly, examples of the present disclosure provide a transmit driver architecture with a predriver circuit having two inverter paths in the final predriver stage (and with different transistor strengths) to offset the current switching timing skew during data transitions, and hence reduce the output voltage spikes.

Example DAC-Based Transmit Driver Architecture with Tunable Impedance Control and Transition Glitch Reduction Techniques As mentioned above, some examples of the present disclosure provide a digital-to-analog converter (DAC)-based transmit driver circuit with an impedance control loop having a tunable impedance for impedance control of the transmit driver. Additionally or alternatively, some examples of the present disclosure provide a transmit driver architecture with an output impedance that is smaller than the load impedance for the transmit driver circuit, thereby allowing the output voltage swing of the transmit driver circuit to exceed the supply voltage of the transmit driver. Additionally or alternatively, some examples of the present disclosure provide a transmit driver with a predriver circuit having two inverter paths in the final predriver stage to offset the current switching timing skew during data transitions.

Figure 2:
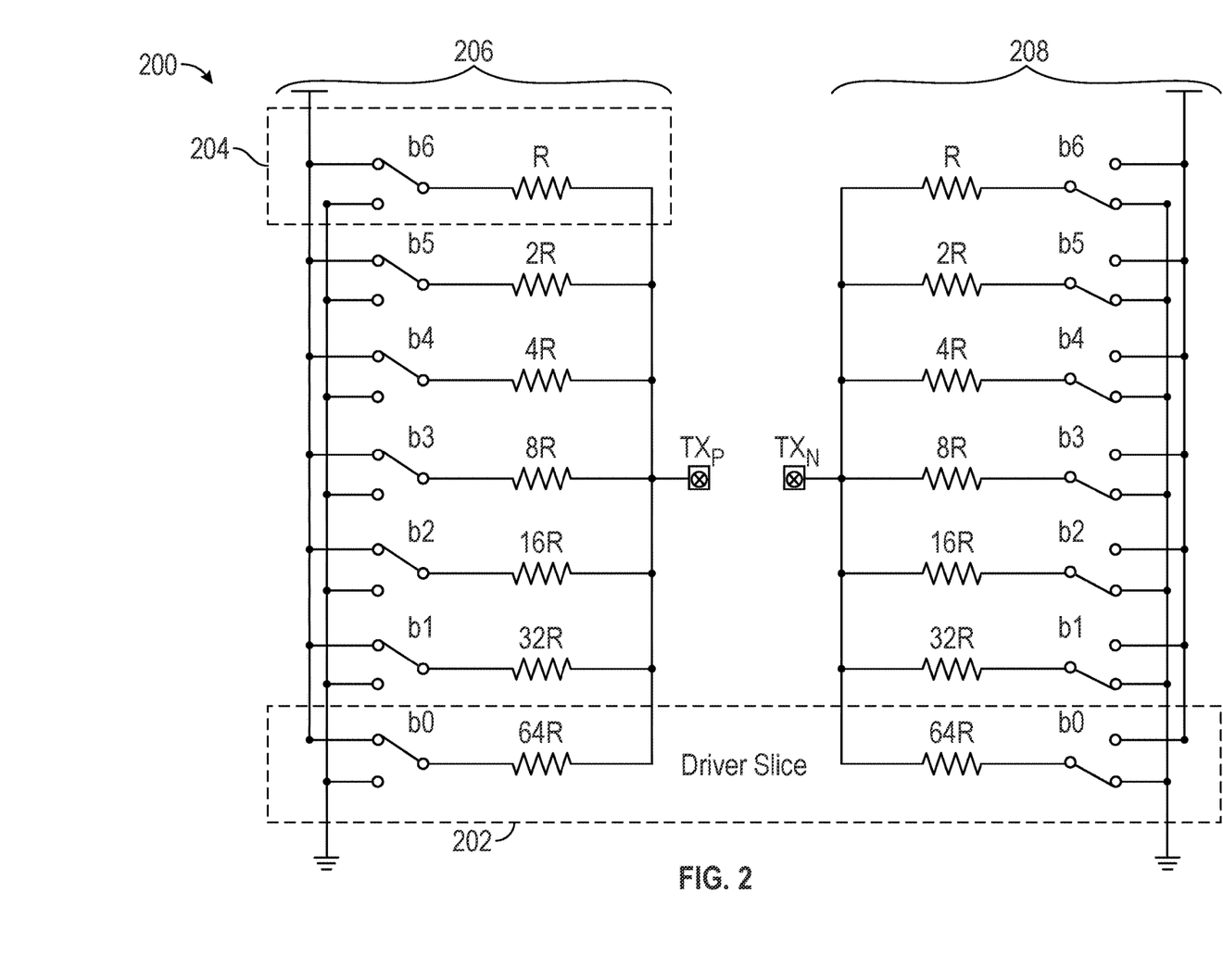
FIG. 2 is an equivalent circuit diagram of an example differential voltage-mode DAC driver array, in which aspects of the present disclosure may be practiced.

FIG. 2 is an equivalent circuit diagram of an example differential voltage-mode DAC-based transmit driver 200, in which aspects of the present disclosure may be practiced. The transmit driver 200 may be used in a SerDes transmitter (e.g., SerDes transmitter 104) in a SerDes circuit (e.g., SerDes circuit 100). As shown in FIG. 2, the transmit driver 200 may be a 7-bit transmit driver circuit, but the transmit driver circuit may be modified to operate with a different number of digital bits.

As illustrated in FIG. 2, the transmit driver 200 may include differential output nodes $TX_P$ and $TX_N$, a first set 206 of switches (labeled "b0" to "b6" for bits 0 through 6 of the 7-bit driver) and resistive elements (labeled "R," "2R," . . . "64R" in binary increments), and a second set 208 of complementary switches and resistive elements. The first set 206 may be coupled to the positive output node $TX_P$, and the second set 208 may be coupled to the negative output node $TX_N$, as shown. The output signals at the differential output nodes $TX_P$ and $TX_N$ may be analog output signals, whereas the input signals are digital signals used to control the corresponding switches in the first and second sets.

Each switch and resistive element pair in a set may be referred to as a partial DAC-based driver slice 204, while complementary pairs of switches and resistive elements from sets 206 and 208 may form a DAC-based driver slice 202 (also referred to as a "DAC slice"). Each switch may serve to connect the resistive element on the same partial DAC slice 204 to either a power supply rail or a reference potential node (e.g., electrical ground), and the connections are configured to be differential between the first set 206 and the second set 208 of switches. For example, if b6 in the first set 206 of switches is connected to the power supply rail, then b6 in the second set 208 of switches is connected to the reference potential node, as depicted in FIG. 2, and vice versa. In this manner and with a load impedance (e.g., the channel impedance) connected between the differential output nodes, the transmit driver 200 functions like a voltage divider between the power supply rail and the reference potential node.

Figure 3:
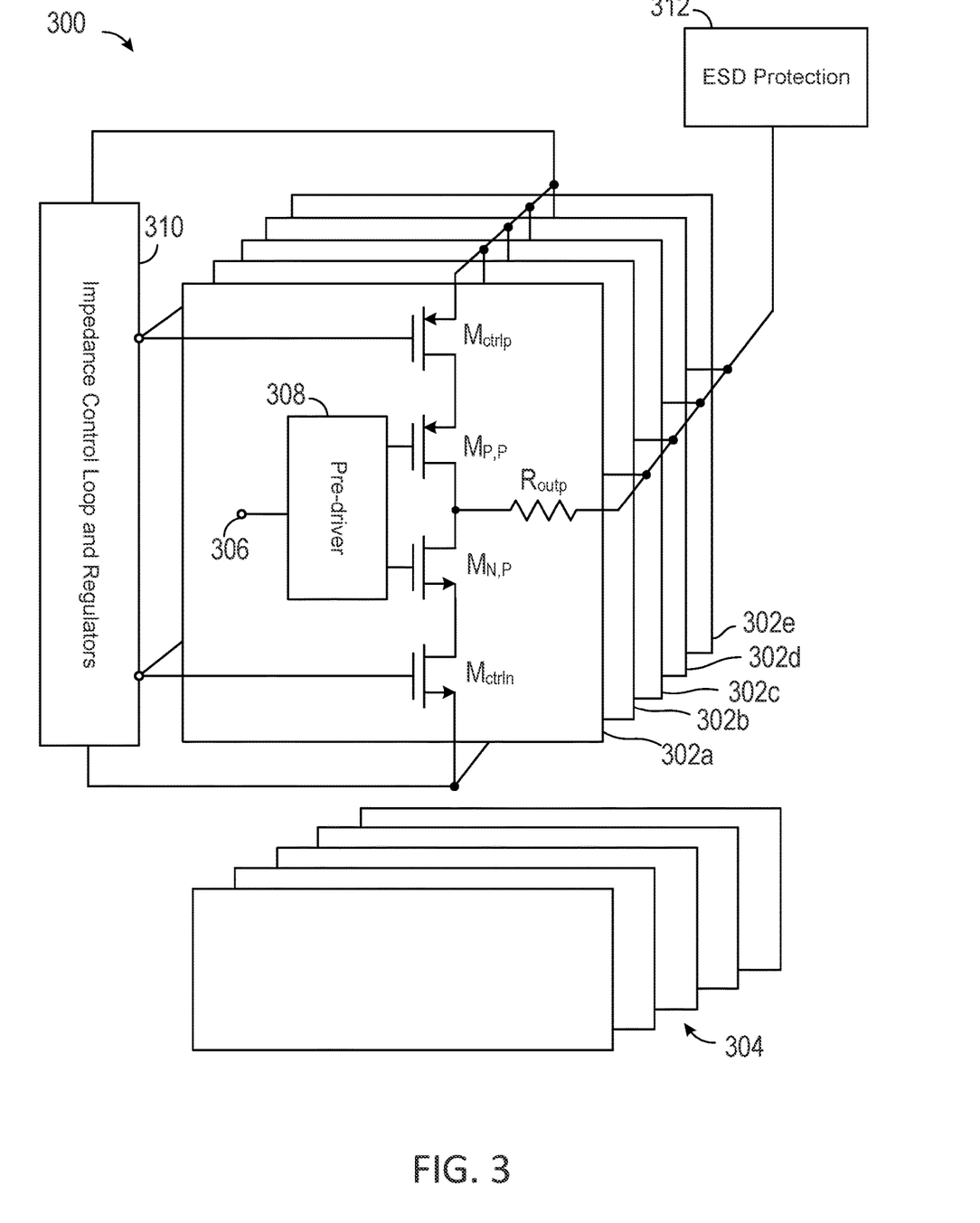
FIG. 3 is a block diagram of an example DAC-based transmit driver architecture, according to certain aspects of the present disclosure.

FIG. 3 is a block diagram of an example DAC-based transmit driver 300, according to certain aspects of the present disclosure. The transmit driver 300 may be used in a SerDes transmitter (e.g., SerDes transmitter 104) in a SerDes circuit (e.g., SerDes circuit 100). As illustrated in FIG. 3, the transmit driver 300 may include multiple partial DAC slices 302a-e, multiple complementary partial DAC slices 304, an impedance control loop and regulators circuit 310, and an electrostatic discharge (ESD) protection 312.

Figure 5:
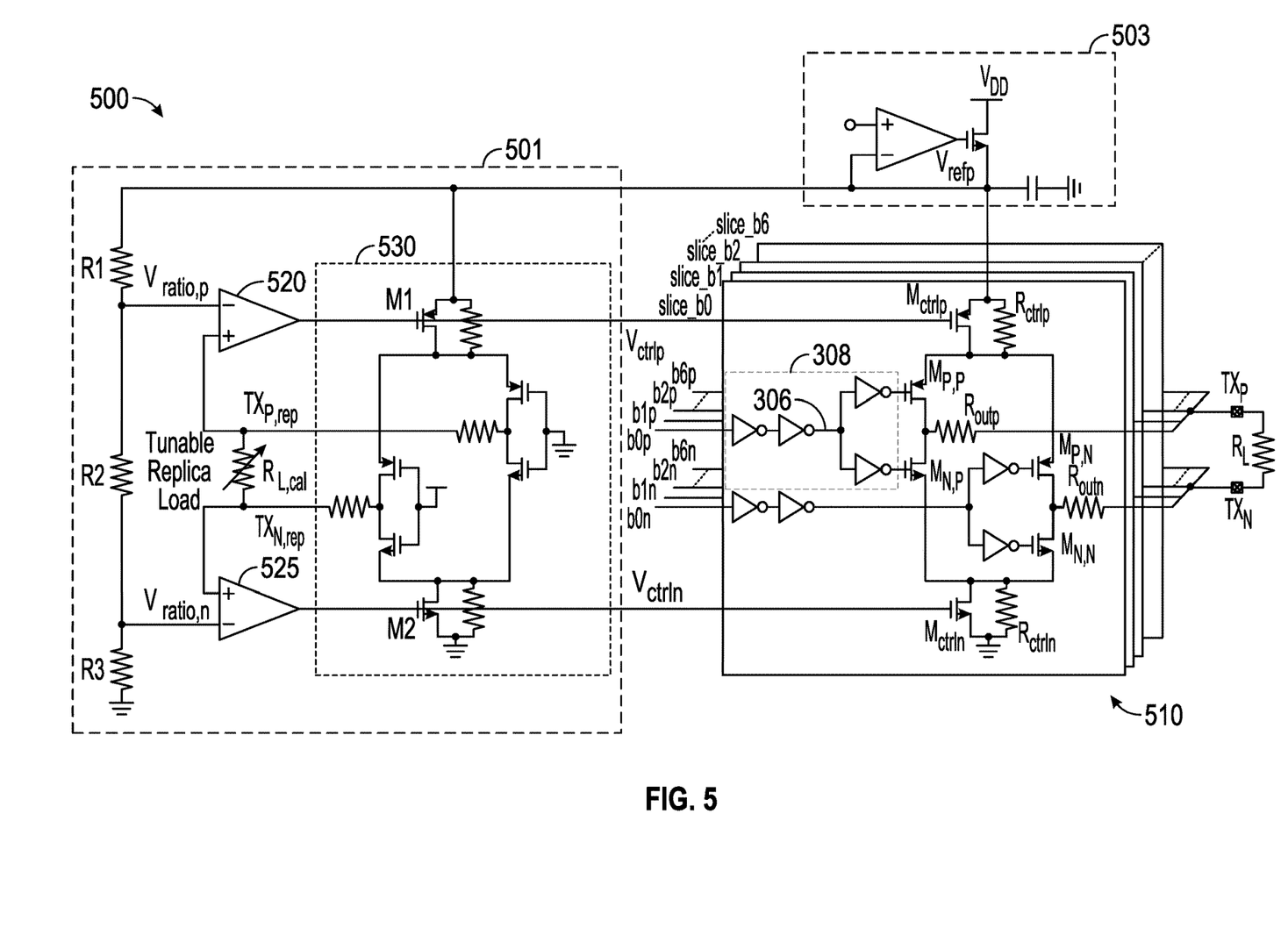
FIG. 5 is a circuit diagram illustrating an example DAC-based transmit driver circuit with an impedance control circuit having a tunable replica load, according to certain aspects of the present disclosure.

The impedance control loop and regulators circuit 310 may include an impedance control circuit 501 and a voltage regulator circuit 503, illustrated in and described with respect to FIG. 5. The impedance control circuit may allow the output impedance of the transmit driver to be adjusted, for example, in an effort to meet return loss and/or output swing specifications. The voltage regulator circuit may provide a regulated output voltage (e.g., $V_{refp}$) from the supply voltage $V_{DD}$ of the power supply rail.

The ESD protection circuit 312 may include ESD diodes coupled to the differential output nodes to protect the transmit driver 300 from electrostatic discharge. The ESD protection circuit 312 may also include inductive elements (e.g., a T-coil network) to isolate the parasitics of the ESD diodes and the pad capacitance of the output nodes from other circuitry in the transmit driver 300, thereby helping to increase the bandwidth of the transmit driver.

The partial DAC slices 302a-e may correspond to the partial DAC slices in the first set 206 in FIG. 2, while the complementary partial DAC slices 304 may correspond to partial DAC slices in the second set 208 in FIG. 2. Although five partial DAC slices 302a-e and five complementary partial DAC slices 304 are illustrated in FIG. 3 as an example, the reader is to understand that the transmit driver circuit may include more or less than five DAC slices.

Each of the partial DAC slices 302a-e may include a predriver circuit 308 with a common input node 306, a pull-up transistor $M_{P,P}$, a pull-down transistor $M_{N,P}$, a header transistor $M_{ctrlp}$, and a footer transistor $M_{ctrln}$. The pull-up transistor $M_{P,P}$ and the header transistor $M_{ctrlp}$ may be implemented as P-type transistors, whereas the pull-down transistor $M_{N,P}$ and the footer transistor $M_{ctrln}$ may be implemented as N-type transistors, as illustrated in FIG. 3. The predriver circuit 308 may have a first output coupled to a gate of the pull-up transistor $M_{P,P}$ and a second output coupled to a gate of the pull-down transistor $M_{N,P}$. As shown in FIG. 3, a drain of the pull-up transistor $M_{P,P}$ may be coupled to a drain of the pull-down transistor $M_{N,P}$. The drains of the pull-up transistor $M_{P,P}$ and the pull-down transistor $M_{N,P}$ may also be coupled to a first terminal of an output resistive element $R_{outp}$ of the slice, whereas a second terminal of the output resistive element $R_{outp}$ may be coupled to the ESD protection circuit 312. A source of the pull-up transistor $M_{P,P}$ may be coupled to a drain of the header transistor $M_{ctrlp}$, and a source of the pull-down transistor $M_{N,P}$ may be coupled to a drain of the footer transistor $M_{ctrln}$. A gate of the header transistor $M_{ctrlp}$ may be coupled to a first output of the impedance control loop and regulators circuit 310, and a gate of the footer transistor $M_{ctrln}$ may be coupled to a second output of the impedance control loop and regulators circuit 310.

In some examples, each of the complementary partial DAC slices 304 may include identical, complementary components as those depicted in the partial DAC slices 302a-e. For example, each of the complementary partial DAC slices 304 may include a predriver circuit, an output resistive element $R_{outn}$, a pull-up transistor $M_{P,N}$, and a pull-down transistor $M_{N,N}$, the sources of the transistors being coupled to the header transistor $M_{ctrlp}$ and the footer transistor $M_{ctrln}$ respectively (as shown in FIG. 5). For certain aspects, each of the complementary partial DAC slices 304 may share the header transistor $M_{ctrlp}$ and the footer transistor $M_{ctrln}$ with one of the partial DAC slices 302a-e associated therewith. For other aspects, the complementary partial DAC slices 304 may receive the same power supply rails from the voltage regulators in the impedance control loop and regulators circuit 310 as are received by the partial DAC slices 302a-e. Although not shown in FIG. 3, the outputs of the complementary partial DAC slices 304 may be coupled to another ESD protection circuit in certain aspects.

Figure 4A:
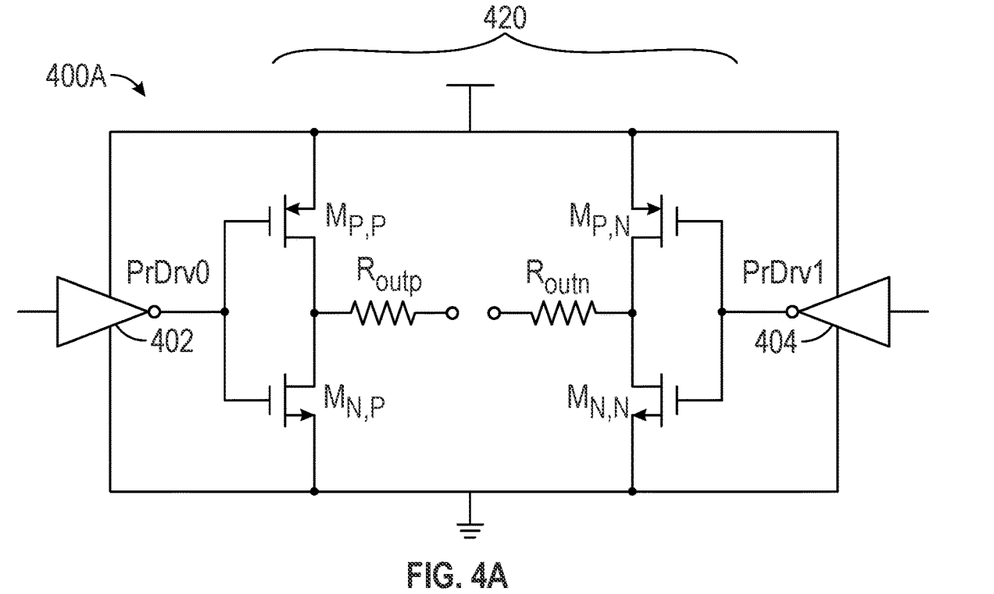
FIG. 4A is a circuit diagram illustrating an example differential voltage-mode driver unit cell.

FIG. 4A is a circuit diagram 400A illustrating an example differential voltage-mode driver unit cell 420 coupled to the outputs of final predriver stages (labeled "PrDrv0" and "PrDrv1"). The driver unit cell 420 may include pull-up transistors $M_{P,P}$ and $M_{P,N}$, pull-down transistors $M_{N,P}$, and $M_{N,N}$, and output resistive elements $R_{outp}$ and $R_{outn}$, as described above with respect to FIG. 3. Each of the final predriver stages may include an inverter (e.g., inverters 402 and 404).

The pull-up transistors $M_{P,P}$ and $M_{P,N}$, and pull-down transistors $M_{N,P}$, and $M_{N,N}$ may act as switches with control signals driven by the final predriver stages. Accordingly, by toggling the output voltages of the final predriver stages for certain DAC slices, the pull-up transistors $M_{P,P}$ and $M_{P,N}$, and pull-down transistors $M_{N,P}$, and $M_{N,N}$ may be turned on or off to change the DAC driver output voltage level.

FIG. 5 is a circuit diagram illustrating an example DAC-based transmit driver 500, according to certain aspects of the present disclosure. As shown, the transmit driver 500 may include a plurality of DAC driver slices 510, an impedance control circuit 501 coupled to the plurality of DAC driver slices, and differential output nodes $TX_P$ and $TX_N$ for coupling to a load impedance $R_L$ of the driver (e.g., a channel impedance). Each of the DAC driver slices 510 may have a differential output pair coupled to the differential output nodes $TX_P$ and $TX_N$.

The impedance control circuit 501 may include a replica driver slice 530 and a tunable impedance $R_{L,cal}$ configured to be adjusted such that this impedance is constant across corners and matches the load impedance $R_L$, regardless of process variations. For example, a passive corner detector may operate to determine the resistor variations during operation of the transmit driver 500, and the tunable impedance $R_{L,cal}$ can be configured based on the detector results to ensure the tunable impedance $R_{L,cal}$ is equal to the load impedance $R_L$. By configuring the tunable impedance $R_{L,cal}$ to be constant across corners, the impedance control circuit 501 can automatically calibrate the driver output impedance by adjusting the voltages on an output pair (labeled "$V_{ctrlp}$" and "$V_{ctrln}$") of the impedance control circuit 501. The output pair $V_{ctrlp}$ and $V_{ctrln}$ may be coupled to gates of the header transistor $M_{ctrlp}$ and the footer transistor $M_{ctrln}$ in each DAC driver slice 510.

In the example of FIG. 5, the impedance control circuit 501 may include a voltage divider having a first resistive element R1, a second resistive element R2, and a third resistive element R3 coupled in series. The impedance control circuit 501 may include a first amplifier 520 having a first input coupled to a first tap (labeled "$V_{ratio,p}$") of the voltage divider and having a second input coupled to a first terminal of the tunable impedance $R_{L,cal}$ and to a first output (labeled "$TX_{P,rep}$") of the differential output pair of the replica driver slice 530. The first tap ($V_{ratio,p}$) of the voltage divider may be coupled to the first resistive element R1 and the second resistive element R2. The impedance control circuit 501 may also include a second amplifier 525 having a first input coupled to a second tap (labeled "$V_{ratio,n}$") of the voltage divider and having a second input coupled to a second terminal of the tunable impedance $R_{L,cal}$ and to a second output (labeled "$TX_{N,rep}$") of the differential output pair of the replica driver slice 530. The second tap of the voltage divider ($V_{ratio,n}$) may be coupled to the second resistive element R2 and the third resistive element R3.

The resistance of the first resistive element R1 may be equal to the resistance of the third resistive element R3. For some examples, a sum of resistances of the first resistive element R1 and the third resistive element R3 may be equal to a resistance of the second resistive element R2. For other examples, a sum of resistances of the first resistive element R1 and the third resistive element R3 may be less than a resistance of the second resistive element R2. A ratio of the sum of the resistances of the first resistive element R1 and the third resistive element R3 to the resistance of the second resistive element R2 may be 90:100, for example.

The transmit driver 500 may include a power supply rail (labeled "$V_{refp}$") generated by the voltage regulator circuit 503 and coupled to the DAC driver slices 510 and the impedance control circuit 501. A differential output impedance (e.g., the sum of $R_{outp}$ and $R_{outn}$ for the multiple DAC driver slices 510) of the transmit driver circuit 500 may be smaller than the load impedance $R_L$ for the transmit driver circuit 500, such that a differential peak-to-peak output voltage swing of the transmit driver circuit 500 at the differential output nodes $TX_P$ and $TX_N$ is configured to be greater than a voltage of the power supply rail ($V_{refp}$).

In some examples, the transmit driver 500 may be designed to achieve a 1 V differential peak-to-peak output swing with lower than a 1 V supply voltage. For example, if the power supply voltage ($V_{refp}$) is set to 0.95 V, the transmit driver 500 may have a differential peak-to-peak output swing of 1 V. In some examples, the ratio of half the differential peak-to-peak output swing ($V_{swing,diff}$) and the power supply voltage ($V_{refp}$) can be expressed as:

$$\frac{V_{swing,diff}/2}{V_{refp}} = \frac{R_2}{R_1 + R_2 + R_3} = \frac{R_L}{R_{out,drv,diff} + R_L}$$

where $R_{out,drv,diff}$ denotes the differential driver output impedance. By setting the ratio of the sum of the resistances of the first resistive element R1 and the third resistive element R3 to the resistance of the second resistive element R2 equal to 90:100, for example, the driver may achieve a 1 V output swing when the power supply voltage ($V_{refp}$) is set to 0.95 V. When $V_{refp}$ is set to a voltage closer to the supply voltage of the predriver circuit 308 (e.g., 0.9 V), the output common-mode noise of the transmit driver 500 may be reduced. Additionally, the voltage drop across the header transistor $M_{ctrlp}$ may be reduced to 0.05V.

Each of the DAC driver slices 510 may include a driver unit cell (discussed further with respect to FIG. 4B), a predriver circuit 308 with a common input node 306, a complementary predriver circuit, a header transistor $M_{ctrlp}$ coupled to the driver unit cell, and a footer transistor $M_{ctrln}$ coupled to the driver unit cell.

The replica driver slice 530 may be a replica of one of the DAC driver slices 510, and may include a replica driver unit cell, a replica header transistor M1 coupled to the replica driver unit cell, and a replica footer transistor M2 coupled to the replica driver unit cell. An output of the first amplifier 520 may be coupled to a gate of the header transistor M1 in the replica driver slice 530 and to a gate of the header transistor $M_{ctrlp}$ in each of the DAC driver slices 510. An output of the second amplifier 525 may be coupled to a gate of the footer transistor M2 in the replica driver slice 530 and to a gate of the footer transistor $M_{ctrln}$ in each of the DAC driver slices 510. The replica driver unit cell may include a partial slice with an input coupled to the reference potential node (e.g., electrical ground for a logic low input) and a complementary partial slice with an input coupled to the power supply rail (e.g., logic high input). As described above, the differential output pair ($TX_{P,rep}$/$TX_{N,rep}$) of the replica driver unit cell may be coupled to the first and second terminals of the tunable impedance $R_{L,cal}$.

According to certain aspects, a resistance of the tunable impedance $R_{L,cal}$ may be based on a weighting of the replica driver slice 530. For example, if a slice for b2 of a 7-bit DAC driver is used as the replica slice, the tunable impedance $R_{L,cal}$ may be tuned to equal:

$$R_L * \frac{2^7 - 1}{2^2} = R_L * \frac{127}{4}$$

The bias points $TX_{P,rep}$ and $TX_{N,rep}$ of the replica driver slice 530 may also remain unchanged over process variations.

Figure 4B:
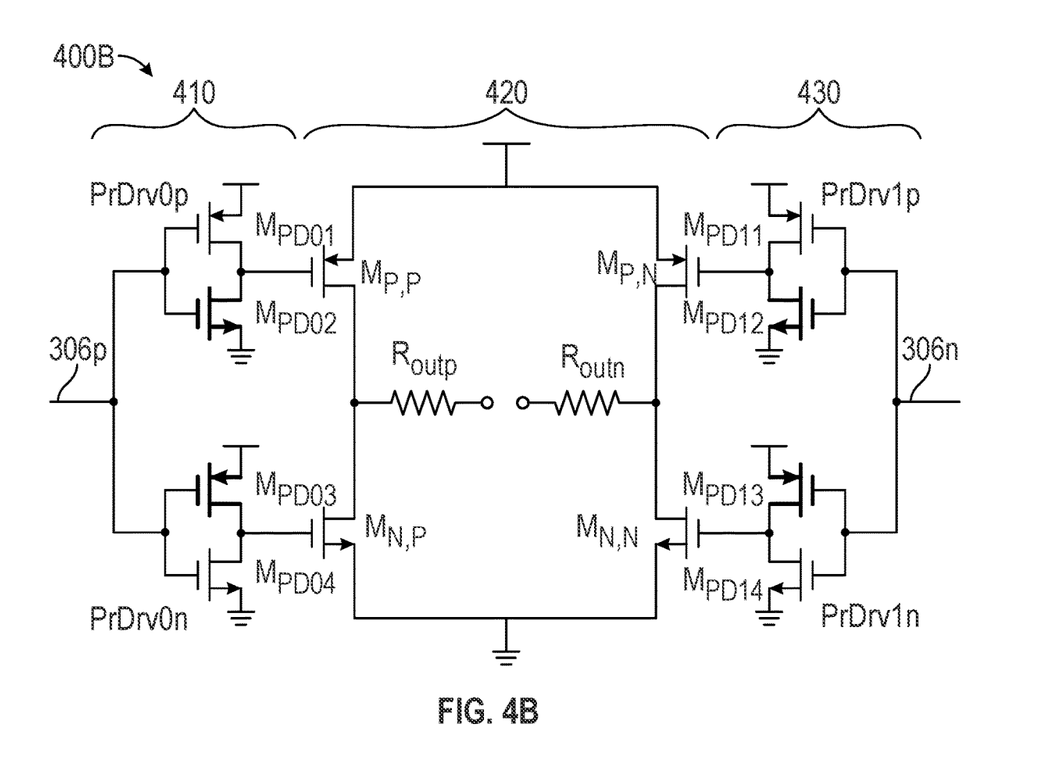
FIG. 4B is a circuit diagram illustrating an example differential voltage-mode driver unit cell with a skewed predriver circuit, according to certain aspects of the present disclosure.

FIG. 4B is a circuit diagram 400B illustrating the differential voltage-mode driver unit cell 420 and skewed final predriver stages 410 and 430, according to certain aspects of the present disclosure. The circuit diagram 400B is similar to the circuit diagram 400A of FIG. 4A, but with two inverter paths in the final predriver stages 410 and 430.

As described above, each DAC slice (e.g., DAC driver slices 510 in FIG. 5) may include a driver unit cell 420, and each driver unit cell 420 may include first and second pull-up transistors $M_{P,P}$ and $M_{P,N}$, first and second pull-down transistors $M_{N,P}$ and $M_{N,N}$, and output resistive elements $R_{outp}$ and $R_{outn}$. The first pull-down transistor $M_{N,P}$ may have a drain coupled to a drain of the first pull-up transistor $M_{P,P}$ and to an output impedance $R_{outp}$. The second pull-down transistor $M_{N,N}$ may have a drain coupled to a drain of the second pull-up transistor $M_{P,N}$ and to an output impedance $R_{outn}$.

Each of the final predriver stages 410, 430 may be the final stage of a predriver circuit (e.g., predriver circuit 308). A first predriver circuit may have a final predriver stage (e.g., final predriver stage 410) which may include a first inverter (labeled "PrDrv0p") having an input coupled to a common input node 306p of the first predriver circuit and having an output functioning as the first output of the first predriver circuit. The final predriver stage 410 may also include a second inverter (labeled "PrDrv0n") having an input coupled to the common input node 306p of the first predriver circuit and having an output serving as the second output of the first predriver circuit.

The first inverter (PrDrv0p) may include a first p-type transistor $M_{PD01}$ having a drain coupled to the first output of the first predriver circuit and a first n-type transistor $M_{PD02}$ having a drain coupled to the first output of the first predriver circuit. The second inverter (PrDrv0n) may include a second p-type transistor $M_{PD03}$ having a drain coupled to the second output of the first predriver circuit and a second n-type transistor $M_{PD04}$ having a drain coupled to the second output of the first predriver circuit.

The transistors in at least one of the first inverter (PrDrv0p) or the second inverter (PrDrv0n) may have different strengths (e.g., different transconductances). For example, the first n-type transistor $M_{PD02}$ may be stronger than the first p-type transistor $M_{PD01}$. In another example, the second p-type transistor $M_{PD03}$ may be stronger than the second n-type transistor $M_{PD04}$. The different strengths may serve to compensate for the pull-up or pull-down transistors' turn-on timing delays caused by non-zero transistor threshold voltages.

A second predriver circuit may have a final predriver stage (e.g., final predriver stage 430) which may include a third inverter (labeled "PrDrv1p") having an input coupled to a common input node 306n of the second predriver circuit and having an output functioning as the first output of the second predriver circuit. The final predriver stage 430 may also include a fourth inverter (labeled "PrDrv1n") having an input coupled to the common input node 306n of the second predriver circuit and having an output serving as the second output of the second predriver circuit.

The third inverter (PrDrv1p) may include a first p-type transistor $M_{PD11}$ having a drain coupled to the first output of the second predriver circuit and a first n-type transistor $M_{PD12}$ having a drain coupled to the first output of the second predriver circuit. The fourth inverter (PrDrv1n) may include a second p-type transistor $M_{PD13}$ having a drain coupled to the second output of the second predriver circuit and a second n-type transistor $M_{PD14}$ having a drain coupled to the second output of the second predriver circuit.

The transistors in at least one of the third inverter (PrDrv1p) or the fourth inverter (PrDrv1n) may have different strengths (e.g., different transconductances). For example, the first n-type transistor $M_{PD12}$ may be stronger than the first p-type transistor $M_{PD11}$. In another example, the second p-type transistor $M_{PD13}$ may be stronger than the second n-type transistor $M_{PD14}$. The different strengths may serve to compensate for the pull-up or pull-down transistors' turn-on timing delays caused by non-zero transistor threshold voltages.

Example Transmit Driver Operations

Figure 6:
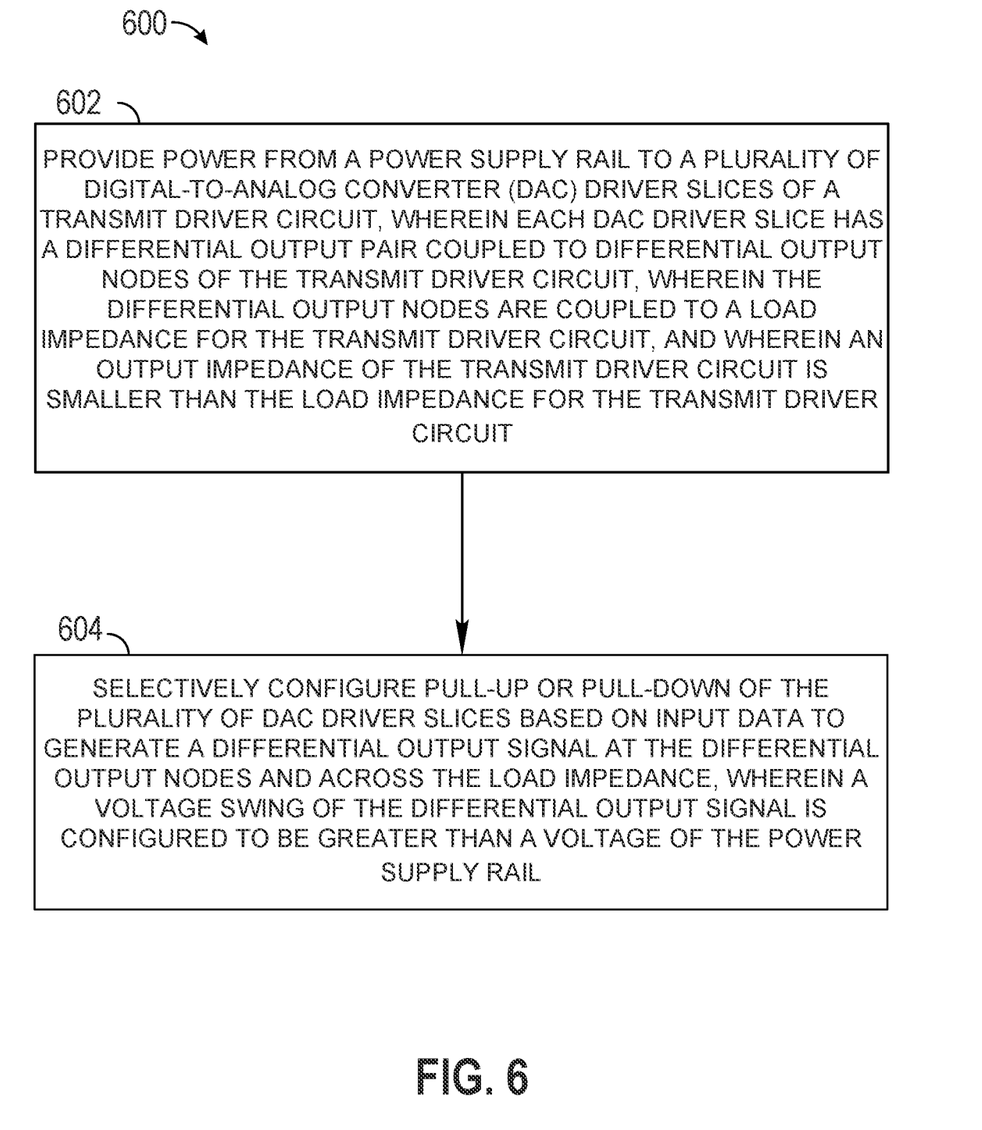
FIG. 6 is a flow diagram of example operations for driving data, according to certain aspects of the present disclosure.

FIG. 6 is a flow diagram of example operations 600 for driving data, according to certain aspects of the present disclosure. The operations 600 may be performed by a transmit driver circuit (e.g., the transmit driver 300 or 500).

The operations 600 may begin, at block 602, by providing power from a power supply rail to a plurality of digital-to-analog converter (DAC) driver slices of a transmit driver circuit. Each DAC driver slice may have a differential output pair coupled to differential output nodes of the transmit driver circuit. The differential output nodes may be coupled to a load impedance for the transmit driver circuit. For some examples, an output impedance of the transmit driver circuit may be smaller than the load impedance for the transmit driver circuit.

At block 604, the operations 600 may further involve selectively configuring pull-up or pull-down of the plurality of DAC driver slices based on input data to generate a differential output signal at the differential output nodes and across the load impedance. A voltage swing of the differential output signal may be configured to be greater than a voltage of the power supply rail.

Example Programmable Integrated Circuits

The transmit driver architecture described herein may be implemented in the transmit driver of a serializer/deserializer (SerDes) system, for example. A SerDes transmitter (e.g., SerDes transmitter 104) may be included in any of various suitable devices or systems, such as an integrated circuit (IC) or module.

One type of IC that may utilize one or more SerDes transmit drivers (e.g., SerDes transmitter 104) is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (1/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

Figure 7:
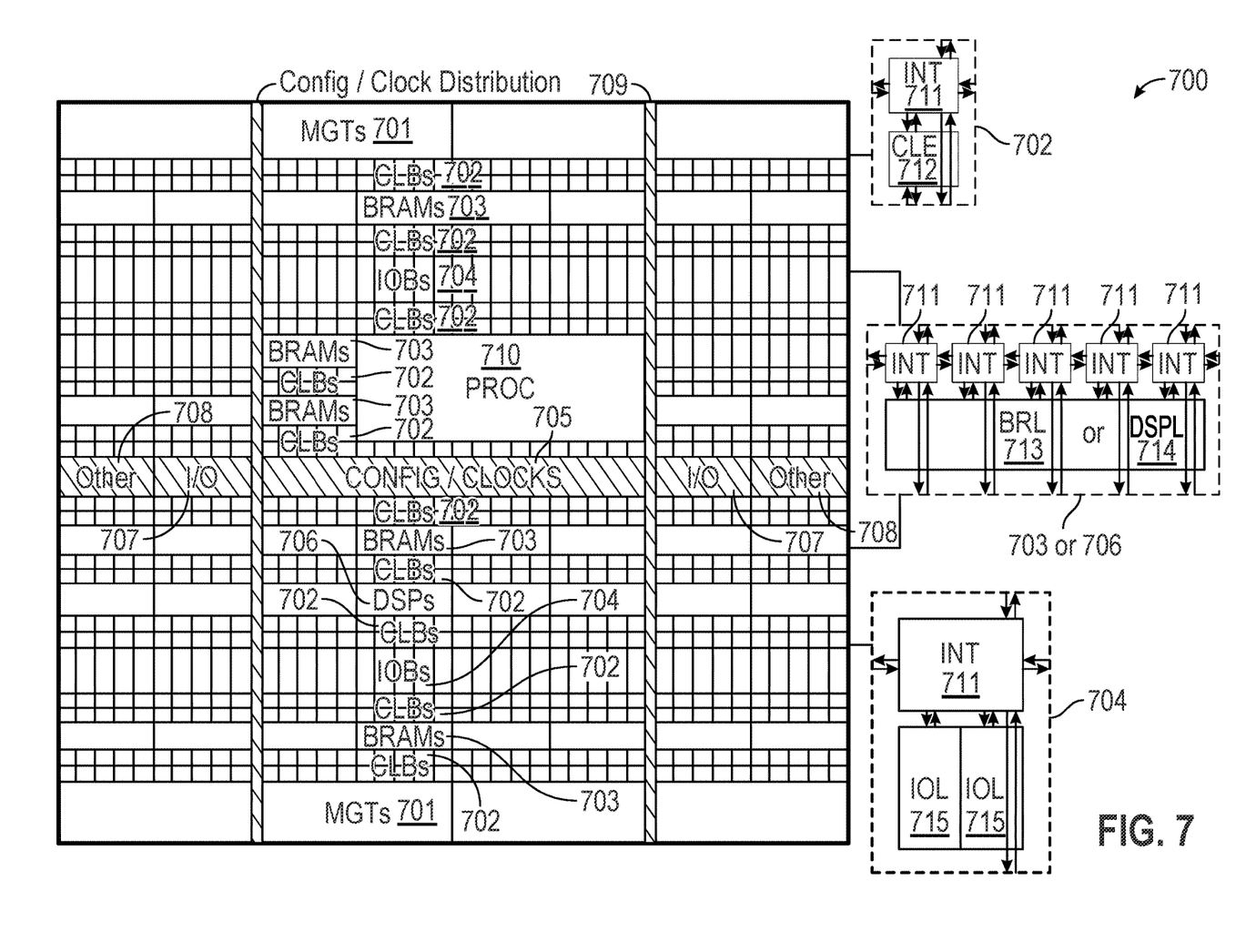
FIG. 7 is a block diagram illustrating an example architecture for a programmable device, in which aspects of the present disclosure may be practiced.

FIG. 7 is a block diagram illustrating an example architecture 700 for a programmable device. The architecture 700 may be implemented within a field programmable gate array (FPGA), for example. As shown, the architecture 700 includes several different types of programmable circuitry (e.g., logic blocks). For example, the architecture 700 may include a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing (DSP) blocks 706, specialized I/O blocks 707 (e.g., configuration ports and clock ports), and other programmable logic 708, such as digital clock managers, analog-to-digital converters (ADCs), system monitoring logic, and the like.

In some FPGAs, each programmable tile includes a programmable interconnect element (INT) 711 having standardized connections to and from a corresponding INT 711 in each adjacent tile. Therefore, the INTs 711, taken together, implement the programmable interconnect structure for the illustrated FPGA. Each INT 711 also includes the connections to and from the programmable logic element within the same tile, as shown by the examples included at the far right of FIG. 7.

For example, a CLB 702 may include a configurable logic element (CLE) 712 that can be programmed to implement user logic plus a single INT 711. A BRAM 703 may include a BRAM logic element (BRL) 713 in addition to one or more INTs 711. Typically, the number of INTs 711 included in a tile depends on the width of the tile. In the pictured example, a BRAM tile has the same width as five CLBs, but other numbers (e.g., four) can also be used. A DSP block 706 may include a DSP logic element (DSPL) 714 in addition to an appropriate number of INTs 711. An IOB 704 may include, for example, two instances of an I/O logic element (IOL) 715 in addition to one instance of an INT 711. As will be clear to a person having ordinary skill in the art, the actual I/O pads connected, for example, to the IOL 715 typically are not confined to the area of the IOL 715.

In the example architecture 700 depicted in FIG. 7, a horizontal area near the center of the die (shown shaded in FIG. 7) is used for configuration, clock, and other control logic (CONFIG/CLOCKS 705). Other vertical areas 709 extending from this central area may be used to distribute the clocks and configuration signals across the breadth of the FPGA.

Some FPGAs utilizing the architecture 700 illustrated in FIG. 7 include additional logic blocks that disrupt the regular row structure making up a large part of the FPGA. The additional logic blocks may be programmable blocks and/or dedicated circuitry. For example, a processor block depicted as PROC 710 spans several rows of CLBs 702 and BRAMs 703.

The PROC 710 may be implemented as a hard-wired processor that is fabricated as part of the die that implements the programmable circuitry of the FPGA. The PROC 710 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 710 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 7 that are external to the PROC 710 may be considered part of the, or the, programmable circuitry of the FPGA.

FIG. 7 is intended to illustrate an example architecture 700 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 7 are exemplary. In an actual FPGA, for example, more than one adjacent row of CLBs 702 is typically included wherever the CLBs appear, in an effort to facilitate the efficient implementation of a user circuit design. The number of adjacent CLB rows, however, can vary with the overall size of the FPGA. Further, the size and/or positioning of the PROC 710 within the FPGA is for purposes of illustration only and is not intended as a limitation of the one or more examples of the present disclosure.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

What is claimed is:

1. A transmit driver circuit comprising:
   differential output nodes for coupling to a load impedance for the transmit driver circuit;
   a plurality of digital-to-analog converter (DAC) driver slices, each DAC driver slice having a differential output pair coupled to the differential output nodes of the transmit driver circuit; and
   an impedance control circuit coupled to the plurality of DAC driver slices and comprising a tunable impedance configured to be adjusted to match the load impedance for the transmit driver circuit.

2. The transmit driver circuit of claim 1, wherein the impedance control circuit further comprises a replica driver slice configured to replicate one of the plurality of DAC driver slices and having a differential output pair coupled to terminals of the tunable impedance.

3. The transmit driver circuit of claim 2, wherein a resistance of the tunable impedance is based on a weighting of the replica driver slice.

4. The transmit driver circuit of claim 2, wherein the impedance control circuit further comprises:
   a voltage divider having a first resistive element, a second resistive element, and a third resistive element coupled in series;
   a first amplifier having a first input coupled to a first tap of the voltage divider and having a second input coupled to a first terminal of the tunable impedance and to a first output of the differential output pair of the replica driver slice, wherein the first tap of the voltage divider is coupled to the first resistive element and the second resistive element; and
   a second amplifier having a first input coupled to a second tap of the voltage divider and having a second input coupled to a second terminal of the tunable impedance and to a second output of the differential output pair of the replica driver slice, wherein the second tap of the voltage divider is coupled to the second resistive element and the third resistive element.

5. The transmit driver circuit of claim 4, wherein:
   each of the plurality of DAC driver slices comprises a driver unit cell, a header transistor coupled to the driver unit cell, and a footer transistor coupled to the driver unit cell;
   the replica driver slice comprises a replica driver unit cell, a header transistor coupled to the replica driver unit cell, and a footer transistor coupled to the replica driver unit cell; and
   an output of the first amplifier is coupled to a gate of the header transistor in the replica driver slice and the header transistor in each of the plurality of DAC driver slices; and
   an output of the second amplifier is coupled to a gate of the footer transistor in the replica driver slice and the footer transistor in each of the plurality of DAC driver slices.

6. The transmit driver circuit of claim 4, further comprising a power supply rail coupled to the plurality of DAC driver slices, wherein an output impedance of the transmit driver circuit is smaller than the load impedance for the transmit driver circuit, such that an output voltage swing of the transmit driver circuit at the differential output nodes is configured to be greater than a voltage of the power supply rail.

7. The transmit driver circuit of claim 6, wherein a sum of resistances of the first resistive element and the third resistive element is less than a resistance of the second resistive element.

8. The transmit driver circuit of claim 7, wherein a ratio of the sum of the resistances of the first resistive element and the third resistive element to the resistance of the second resistive element is 90:100.

9. The transmit driver circuit of claim 1, further comprising a power supply rail coupled to the plurality of DAC driver slices, wherein an output impedance of the transmit driver circuit is smaller than the load impedance for the transmit driver circuit, such that an output voltage swing of the transmit driver circuit at the differential output nodes is configured to be greater than a voltage of the power supply rail.

10. The transmit driver circuit of claim 1, wherein:
each DAC driver slice further comprises:
a driver unit cell comprising a pull-up transistor and a pull-down transistor having a drain coupled to a drain of the pull-up transistor; and
a predriver having a first output coupled to a gate of the pull-up transistor and having a second output coupled to a gate of the pull-down transistor, the predriver comprising:
a first inverter having an input coupled to a common input node of the predriver and having an output coupled to the first output of the predriver; and
a second inverter having an input coupled to the common input node of the predriver and having an output coupled to the second output of the predriver; and
transistors in at least one of the first inverter or the second inverter have different strengths.

11. The transmit driver circuit of claim 10, wherein:
the first inverter comprises:
a first p-type transistor having a drain coupled to the first output of the predriver; and
a first n-type transistor having a drain coupled to the first output of the predriver, the first n-type transistor being stronger than the first p-type transistor; and
the second inverter comprises:
a second p-type transistor having a drain coupled to the second output of the predriver; and
a second n-type transistor having a drain coupled to the second output of the predriver, the second p-type transistor being stronger than the second n-type transistor.

12. A programmable integrated circuit (IC) comprising a transmitter of a serializer/deserializer link, wherein the transmitter comprises the transmit driver circuit of claim 1.

13. A transmit driver circuit comprising:
differential output nodes for coupling to a load impedance for the transmit driver circuit;
a plurality of digital-to-analog converter (DAC) driver slices, each DAC driver slice having a differential output pair coupled to the differential output nodes of the transmit driver circuit; and
a power supply rail coupled to the plurality of DAC driver slices, wherein an output impedance of the transmit driver circuit is smaller than the load impedance for the transmit driver circuit, such that an output voltage swing of the transmit driver circuit at the differential output nodes is configured to be greater than a voltage of the power supply rail.

14. A programmable integrated circuit (IC) comprising a transmitter of a serializer/deserializer link, wherein the transmitter comprises the transmit driver circuit of claim 13.

15. A transmit driver circuit comprising:
a plurality of digital-to-analog converter (DAC) driver slices, each DAC driver slice comprising:
a driver unit cell comprising a first pull-up transistor and a first pull-down transistor having a drain coupled to a drain of the first pull-up transistor; and
a first predriver having a first output coupled to a gate of the first pull-up transistor and having a second output coupled to a gate of the first pull-down transistor, wherein:
the first predriver comprises:
a first inverter having an input coupled to a common input node of the first predriver and having an output coupled to the first output of the first predriver; and
a second inverter having an input coupled to the common input node of the first predriver and having an output coupled to the second output of the first predriver; and
transistors in at least one of the first inverter or the second inverter have different strengths.

16. The transmit driver circuit of claim 15, wherein:
the first inverter comprises:
a first p-type transistor having a drain coupled to the first output of the first predriver; and
a first n-type transistor having a drain coupled to the first output of the first predriver, the first n-type transistor being stronger than the first p-type transistor; and
the second inverter comprises:
a second p-type transistor having a drain coupled to the second output of the first predriver; and
a second n-type transistor having a drain coupled to the second output of the first predriver, the second p-type transistor being stronger than the second n-type transistor.

17. The transmit driver circuit of claim 15, wherein:
the driver unit cell in each DAC driver slice further comprises a second pull-up transistor and a second pull-down transistor having a drain coupled to a drain of the second pull-up transistor;
each DAC driver slice further comprises a second predriver having a first output coupled to a gate of the second pull-up transistor and having a second output coupled to a gate of the second pull-down transistor;
the second predriver comprises:
a third inverter having an input coupled to a common input node of the second predriver and having an output coupled to the first output of the second predriver; and
a fourth inverter having an input coupled to the common input node of the second predriver and having an output coupled to the second output of the second predriver; and
transistors in at least one of the third inverter or the fourth inverter have different strengths.

18. The transmit driver circuit of claim 17, wherein:
the third inverter comprises:
a first p-type transistor having a drain coupled to the first output of the second predriver; and a first n-type transistor having a drain coupled to the first output of the second predriver, the first n-type transistor being stronger than the first p-type transistor; and the fourth inverter comprises:

a second p-type transistor having a drain coupled to the second output of the second predriver; and a second n-type transistor having a drain coupled to the second output of the second predriver, the second p-type transistor being stronger than the second n-type transistor.

19. The transmit driver circuit of claim 15, further comprising a power supply rail coupled to the plurality of DAC driver slices, wherein an output impedance of the transmit driver circuit is smaller than a load impedance for the transmit driver circuit, such that an output voltage swing of the transmit driver circuit is configured to be greater than a voltage of the power supply rail.

20. A programmable integrated circuit (IC) comprising a transmitter of a serializer/deserializer link, wherein the transmitter comprises the transmit driver circuit of claim 15.

* * * * *